(12) United States Patent
Schulze et al.

(10) Patent No.: US 8,034,700 B2
(45) Date of Patent: Oct. 11, 2011

(54) METHOD OF FABRICATING A DIODE

(75) Inventors: Hans-Joachim Schulze, Taufkirchen (DE); Franz-Josef Niedernostheide, Muenster (DE); Reiner Barthelmess, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/648,749

(22) Filed: Dec. 29, 2009

(65) Prior Publication Data

US 2010/0136774 A1 Jun. 3, 2010

Related U.S. Application Data

(62) Division of application No. 11/969,017, filed on Jan. 3, 2008, now Pat. No. 7,838,969.

(30) Foreign Application Priority Data

Jan. 4, 2007 (DE) .......................... 10 2007 001 108

(51) Int. Cl.
*H01L 21/22* (2006.01)
(52) U.S. Cl. ........ 438/542; 438/540; 438/543; 438/550; 257/487; 257/492; 257/E21.135
(58) Field of Classification Search .................. 257/330, 257/502, 655; 438/540–550
See application file for complete search history.

(56) References Cited

U.S. PATENT DOCUMENTS

| 4,805,004 | A  | * | 2/1989  | Gandolfi et al. ............... 257/496 |
| 5,939,769 | A  | * | 8/1999  | Frisina et al. .................. 257/592 |
| 6,351,024 | B1 |   | 2/2002  | Ruff et al. |
| 2003/0122151 | A1 |   | 7/2003  | Mauder et al. |
| 2003/0197247 | A1 |   | 10/2003 | Mauder et al. |
| 2005/0280076 | A1 | * | 12/2005 | Barthelmess et al. ........ 257/327 |
| 2006/0118852 | A1 |   | 6/2006  | Rueb |
| 2006/0211179 | A1 |   | 9/2006  | Siemieniec et al. |
| 2006/0258081 | A1 |   | 11/2006 | Kocon et al. |
| 2007/0007587 | A1 |   | 1/2007  | Barthelmess et al. |

FOREIGN PATENT DOCUMENTS

| DE | 4342482      | 6/1995 |
| DE | 10240107     | 3/2004 |
| DE | 10316222     | 1/2005 |
| DE | 102005009000 | 9/2006 |
| DE | 102005031398 | 1/2007 |

* cited by examiner

*Primary Examiner* — Matthew Smith
*Assistant Examiner* — Mamadou Diallo
(74) *Attorney, Agent, or Firm* — Dicke, Billig & Czaja, PLLC

(57) ABSTRACT

A method of fabricating a diode is disclosed. One embodiment provides a semiconductor body having a front and a back, opposite the front in a vertical direction of the semiconductor body. The semiconductor body contains, successively in the vertical direction from the back to the front, a heavily n-doped zone, a weakly n-doped zone, a weakly p-doped zone and a heavily p-doped zone. In the vertical direction, the weakly p-doped zone has a thickness of at least 25% and at most 50% of the thickness of the semiconductor body.

12 Claims, 3 Drawing Sheets

METHOD OF FABRICATING A DIODE

CROSS-REFERENCE TO RELATED APPLICATIONS

This Divisional Patent Application claims priority to U.S. patent application Ser. No. 11/969,017, filed on Jan. 3, 2008, which claims priority to German Patent Application No. DE 10 2007 001 108.5-33, filed on Jan. 4, 2007, both of which are incorporated herein by reference.

BACKGROUND

Diodes, for example, power diodes, may include heavily p-doped layer, a weakly n-doped layer and a heavily n-doped layer. Such diodes are used primarily in power electronics, for example in high-voltage DC transmission systems. They can have high reverse voltages of a few kilovolts, e.g., more than 4000 V. It is known that such diodes generally experience a transient voltage overshoot in the anode/cathode voltage when turned on with high current gradients.

The maximum transient voltage overshoot that occurs when the diode is turned on is usually set by a suitable choice of diode thickness or a suitable choice of doping for the weakly n-doped zone. In this case, a reduction in the diode thickness or an increase in the doping concentration of the weakly n-doped zone results in lower overvoltages.

This measure, however, is accompanied by a reduction in the diode's reverse voltage. Furthermore, an increase in the doping concentration of the weakly n-doped zone affects the diode's stability toward cosmic radiation.

SUMMARY

One embodiment relates to a method of fabricating a diode that has a semiconductor body that contains, successively in a vertical direction, a heavily n-doped zone, a weakly n-doped zone, a weakly p-doped zone and a heavily p-doped zone. The thickness of the weakly p-doped zone is at least 25% and at most 50% of the thickness of the semiconductor body.

Within the context of the present disclosure, the term "thickness" means dimension in a vertical direction.

The thickness of the weakly n-doped zone is particularly dependent on the diode's reverse voltage which is to be achieved. By way of example, every 10 V of reverse voltage may require the weakly n-doped layer to have a thickness of 1 µm. With these values, a diode with a reverse voltage of 4000 V means that the weakly n-doped layer has a thickness of 400 µm. Accordingly, thicknesses of 450 µm or 500 µm are obtained for reverse voltages of 4500 V or 5000 V.

The net acceptor dose, i.e. the integral of the net dopant concentration, in the weakly p-doped zone is in one example between $1 \cdot 10^{12}$ cm$^{-2}$ and $2 \cdot 10^{12}$ cm$^{-2}$.

In one embodiment, the electrical field strength arising at the junction between the weakly n-doped layer and the heavily n-doped layer when a breakdown voltage is applied is between $2 \cdot 10^4$ V/cm and $1 \cdot 10^5$ V/cm, for example, $5 \cdot 10^4$ V/cm.

To reduce the electrical field in the space charge zone, which is formed in the diode's blocking state between the weakly p-doped layer and the weakly n-doped layer, evenly in the edge region of the diode, the semiconductor body may have an edge bevel which extends from the front to beyond the pn junction formed between the weakly p-doped zone and the weakly n-doped zone.

The net dopant concentration of the weakly p-doped zone is, in one embodiment, chosen to be approximately constant in the vertical direction or falls from the surface to the depth with the smallest possible gradient.

To further reduce the transient voltage overshoot which occurs when the diode is turned on and to achieve soft turn-off of the diode, the diode can also be provided with a deep n-doped field stop zone which is arranged between the heavily n-doped zone and the weakly p-doped zone.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
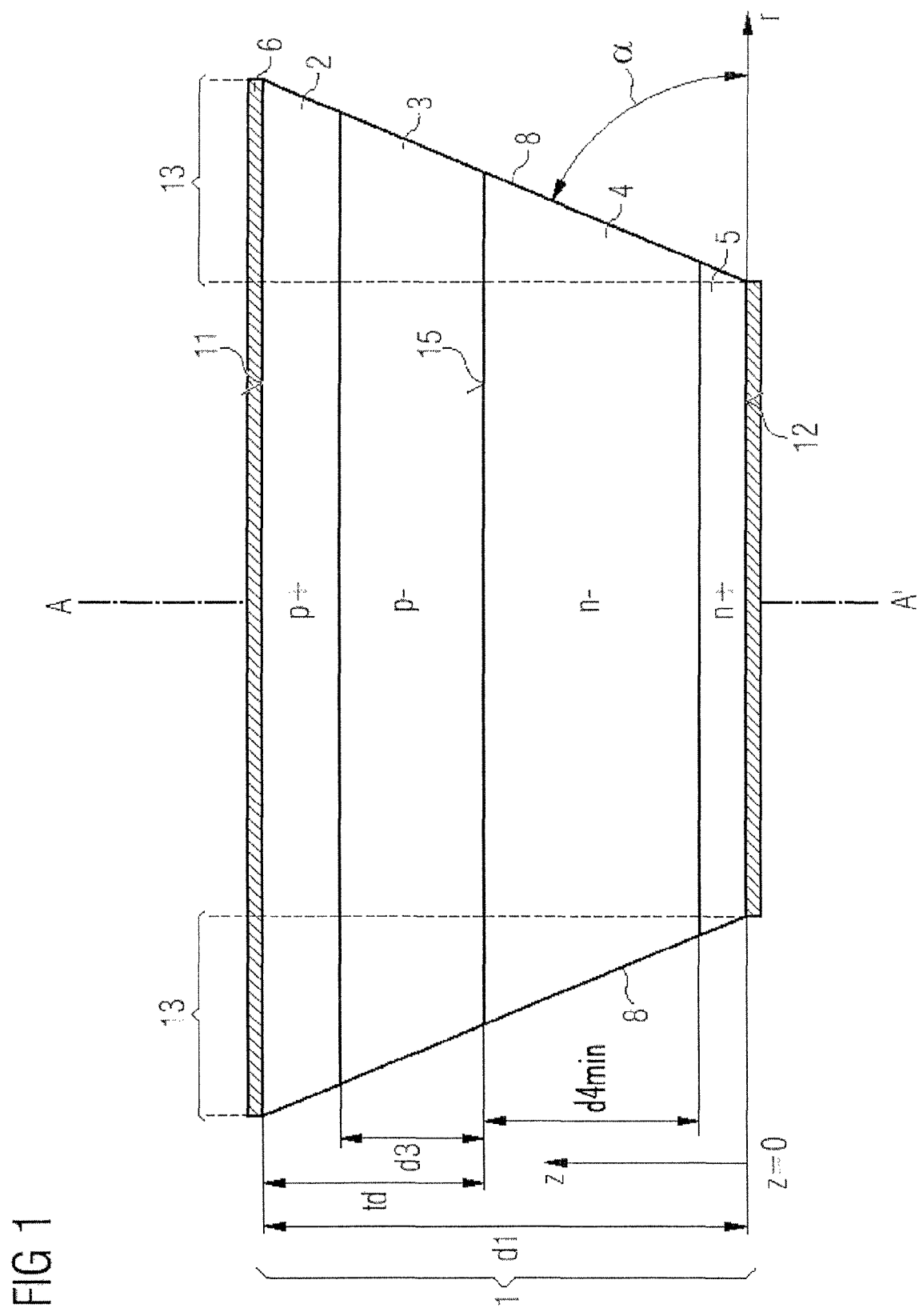
FIG. 1 illustrates a cross section through diode in which a weakly p-doped zone is arranged between the heavily p-doped zone and the weakly n-doped zone.

FIG. 1 illustrates a cross section through a diode that has a semiconductor body 1 which includes successively in a vertical direction z: a heavily n-doped zone 5, a weakly n-doped zone 4, a weakly p-doped zone 3 and a heavily p-doped zone 2.

The front 11 of the semiconductor body 1 has an anode metallization 6, and its back 12, opposite its front 11, has a cathode metallization 7. In addition, in a lateral direction r which is at right angles to the vertical direction z, the edge region 13 of the semiconductor body 1 has an optional edge bevel which extends from the front 11 to beyond the pn junction 15 formed between the weakly p-doped zone 3 and the weakly n-doped zone 4 as far as the back 12. The edge bevel is formed by virtue of the back 12 of a lateral edge 8 of the semiconductor body 1 enclosing an angle α of, in one embodiment, 30° to 50°.

In one embodiment, the edge bevel 8, the edge region 8 of the semiconductor body 1 may also have a planar edge termination, for example, one or more field rings with a respective field plate which is arranged on the front 11 and makes contact with the relevant field ring.

In the vertical direction z, the semiconductor body 1 has a thickness d1. The thickness d3 of the weakly p-doped zone 3 in the vertical direction z is at least 25% and at most 50% of the thickness d1 of the semiconductor body 1.

A reverse voltage across the diode is essentially reduced in the weakly n-doped zone 4, which is why the latter's smallest thickness d4min must not be below a prescribed value if the diode is meant to withstand a particular reverse voltage. In this case, the smallest thickness d4min should be understood to mean the smallest local thickness of the weakly n-doped layer 4 which in a vertical direction, i.e. at right angles to the front and back 11 and 12, with only those regions of the weakly n-doped layer 4 which are adjoined by semiconductor material in the vertical direction both above and below the weakly n-doped layer being taken into account. In the case of the diode illustrated in FIG. 1, the thickness of the weakly n-doped zone 4 is constant and hence identical to the minimum thickness d4min if the edge region 13 is ignored.

Since every 10 volts of reverse voltage require the weakly n-doped zone 4 to have a thickness of approximately 1 μm, a diode with a reverse voltage of 4 kV has a minimum thickness d4min of at least 400 μm. Accordingly, diodes with reverse voltages of 4.5 kV or of 5 kV have minimum thickness d4min of at least 450 μm or at least 500 μm.

The net acceptor concentration of the weakly p-doped zone 3 is, in one example, between $1 \cdot 10^{12}$ cm$^{-3}$ and $1 \cdot 10^{14}$ cm$^{-3}$, or in another example, between $5 \cdot 10^{12}$ cm$^{-3}$ and $5 \cdot 10^{13}$ cm$^{-3}$.

The net acceptor dose of the weakly p-doped zone 3 is in one example between $1 \cdot 10^{12}$ cm$^{-2}$ and $2 \cdot 10^{12}$ cm$^{-2}$.

The thickness d1 of the semiconductor body 1 in the vertical direction z is in one embodiment dimensioned such that a field strength of at least $5 \cdot 10^{4}$ V/cm is produced at the junction between the weakly n-doped zone 4 and the heavily n-doped zone 5 at the diode's breakdown voltage. This means that the diode is designed for the space charge zone to "punch through" the weakly n-doped zone 4.

To achieve an even reduction in the electrical field in a semiconductor body 1 in the diode's blocking state in the edge region 13 and the region close to the edge, the semiconductor body may have an edge termination, for example an edge bevel 8. In this case, the edge bevel 8 extends from the front 11 of the semiconductor body 1 to beyond the pn junction 15 between the weakly p-doped zone 3 and the weakly n-doped zone 4.

Instead of or in addition to an edge bevel 8, other edge terminations, for example field rings with or without field plates, may also be provided on the front 11 of the semiconductor body 1.

Figure 2:
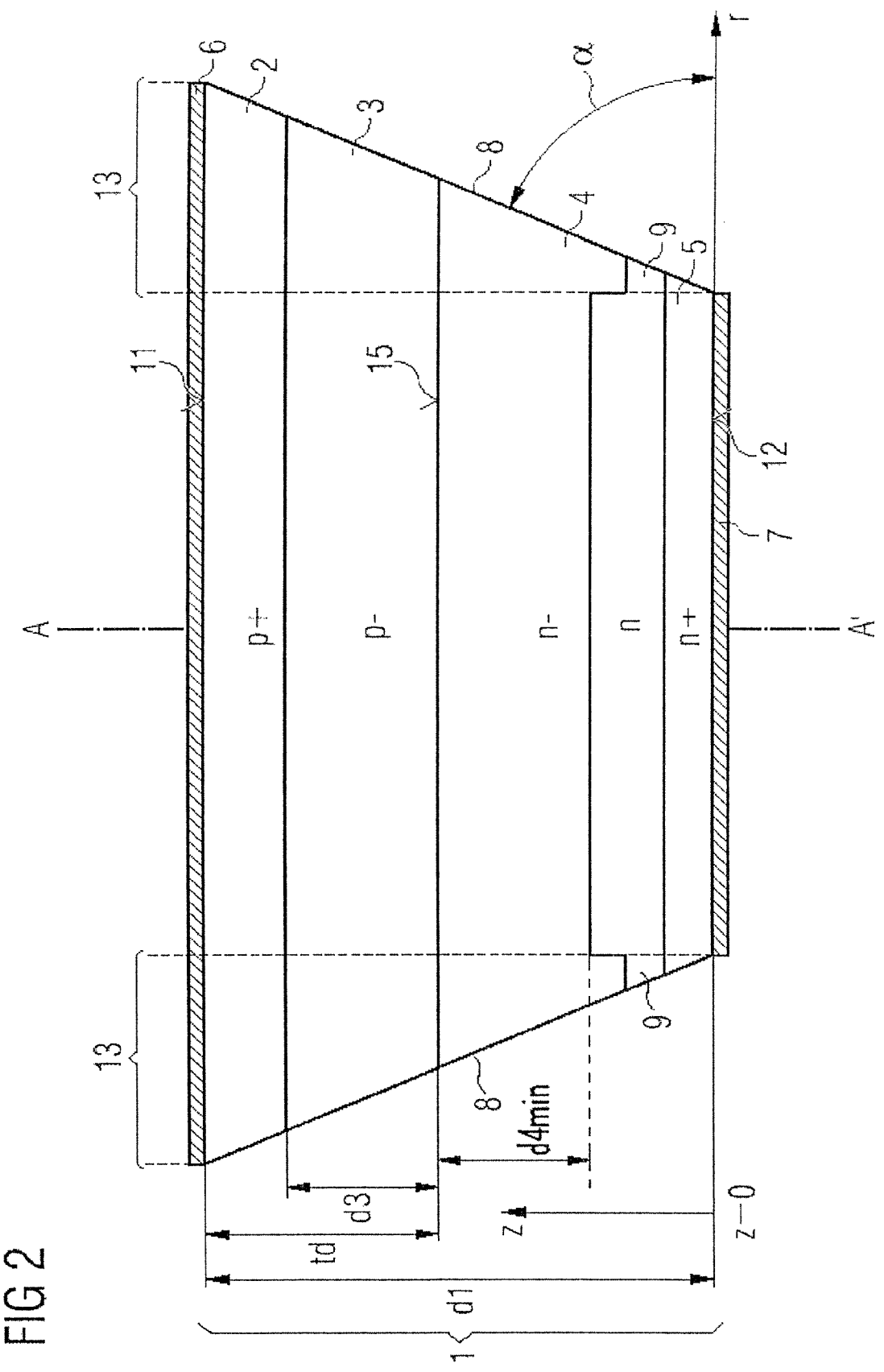
FIG. 2 illustrates a diode as illustrated in FIG. 1 in which an n-doped field stop zone is additionally arranged between the heavily n-doped zone and the weakly n-doped zone.

As FIG. 2 illustrates, the diode may optionally have an n-doped field stop zone 9 which is arranged between the weakly p-doped zone 3 and the heavily n-doped zone 5. The field stop zone 9 can directly adjoin the heavily n-doped zone 5 in the lateral direction—as FIG. 2 illustrates—or—what is not illustrated—can be at a distance therefrom in the vertical direction z. In the latter case, there is then a section of the weakly n-doped zone 4 between the field stop zone 9 and the heavily n-doped zone 5.

The field stop zone 9 illustrated in FIG. 2 is of simple contiguous design. In one embodiment, the field stop zone 9 may also be formed from two or more subzones, however, which are at a distance from one another in the lateral direction r and/or the vertical direction z.

In one embodiment, the side of the field stop zone 9 which faces the front 11 is at a greater distance from the front 11 in the edge region 13 of the semiconductor body 1 than in the central region of the semiconductor body 1.

In the vertical direction z, the weakly p-doped zone 3 has a net dopant concentration $N_D$ which is in one embodiment approximately constant or which has the smallest possible gradient in the vertical direction z, the net acceptor doping concentration in one example falling monotonously as the distance from the surface increases.

The net dopant concentration $N_D$ in the region of the field stop zone 9 is in one embodiment chosen to be greater than the net dopant concentration $N_D$ in the region of the weakly n-doped zone 4, but less than the net dopant concentration $N_D$ in the region of the heavily n-doped zone 5.

Besides having a reduced voltage overshoot upon turn-on in comparison with a diode based on the prior art, the additional weakly p-doped zone 3 also has an affect on the edge termination of the diode if the latter is provided with a beveled edge 8 to improve edge blocking ability.

Another effect of the additional weakly p-doped zone 3 is when the diode is turned off with high current gradients from the conductive state to the blocking state. The holes which then flow away to the heavily p-doped zone 2 from the charge carrier plasma at least partially compensate for the negative acceptor charges in the space charge zone of the heavily p-doped zone 2, and therefore ensure a reduction in the electrical field strength and an accompanying reduction in the charge carrier generation rate as a result of impact ionization processes. For the dynamic avalanche, there may even be a positive effect if the net acceptor dose of the weakly p-doped zone 3 in the vertical direction z is greater than approximately $1.3 \cdot 10^{12}$ cm$^{-2}$. This applies particularly if the net dopant concentration $N_D$ and the doping gradient in the vertical direction z of the semiconductor body 1 are set such that the change to the blocking state in the weakly p-doped zone 3 dynamically produces a relatively small gradient for the electrical field strength in the vertical direction z.

By way of example, the weakly p-doped zone 3 can be fabricated by taking a semiconductor body 1 which has a weakly n-conductive base doping $N_D$ and introducing aluminum from the front 11. To this end the front 11 may initially be coated with aluminum which can then be diffused into the semiconductor body 1 to a depth td (see FIGS. 1 and 2) of between 25% and 50% of the total thickness d1, in one embodiment between 40% and 50% of the total thickness d1, in an insertion step.

In one embodiment, the method provides for aluminum to be introduced into the semiconductor body 1 by ion implantation, in one embodiment, from the front 11, and then for an insertion step to be provided.

The n-doped field stop zone 9 may be fabricated by diffusing in sulfur and/or selenium from the back.

In one embodiment, the weakly p-doped zone 3 may also have a net dopant concentration $N_D$ which is constant or approximately constant in the vertical direction z. In this case, a semiconductor body 1 with a p-type base doping may also be used to fabricate the diode. Deep n-type doping profile with a low net dopant concentration $N_D$ and a small gradient from the net dopant concentration $N_D$ in the vertical direction z is produced in the semiconductor body by diffusing in sulfur and/or selenium and/or hydrogen from the back 12 of the semiconductor body 1. Hydrogen is diffused in from a plasma or a combination of proton irradiation followed by a heating step in which the semiconductor body 1 is heated to temperatures of between 350° C. and 550° C., so that hydrogen-correlated donors are formed.

Proton irradiation allows soft turn-off of the diode.

Figure 3:
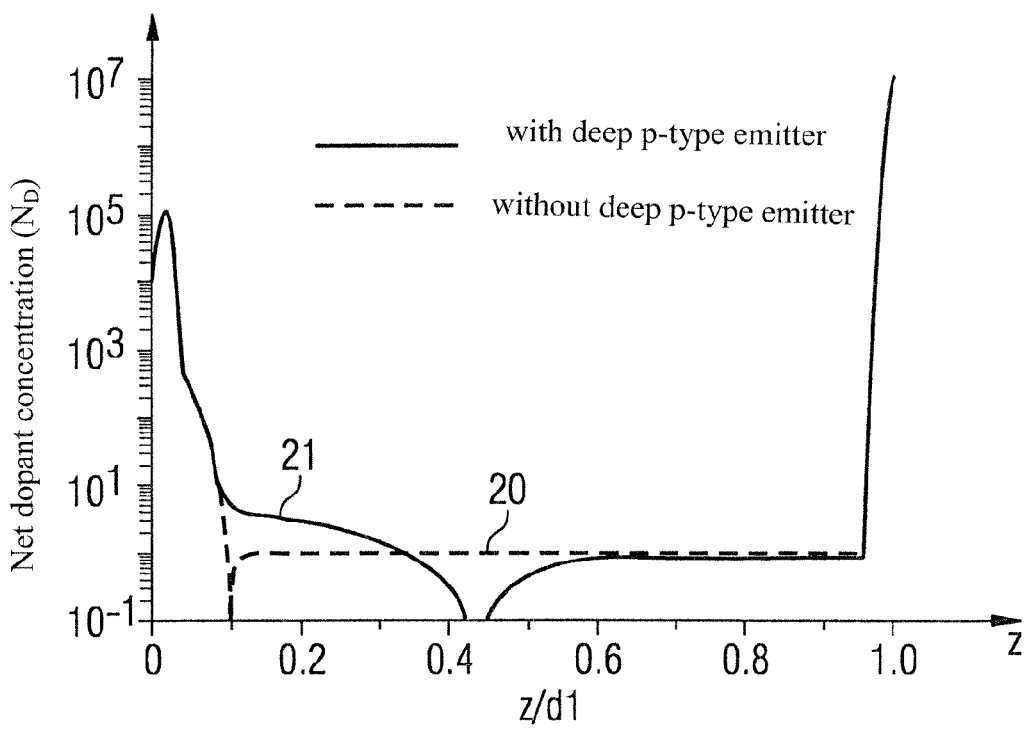
FIG. 3 illustrates the profile of the net dopant concentrations in the vertical direction of a first diode in comparison with a second diode.

The diode illustrated in FIGS. 2 and 3 is rotationally symmetrical about an axis of symmetry A-A', i.e. it has a circular cross section in every sectional plane at right angles to the vertical direction z.

In one embodiment, the axis of symmetry A-A' may also be a quaternary axis of symmetry, i.e. the cross section of the diode is square in every sectional plane at right angles to the vertical direction z.

FIG. 3 contrasts the profile of the net dopant concentration 20 of a conventional diode and the profile of the net dopant concentration 21 of a diode having an additional weakly p-doped zone 8. Both diodes have the same thickness d1 in the vertical direction z.

Figure 4:
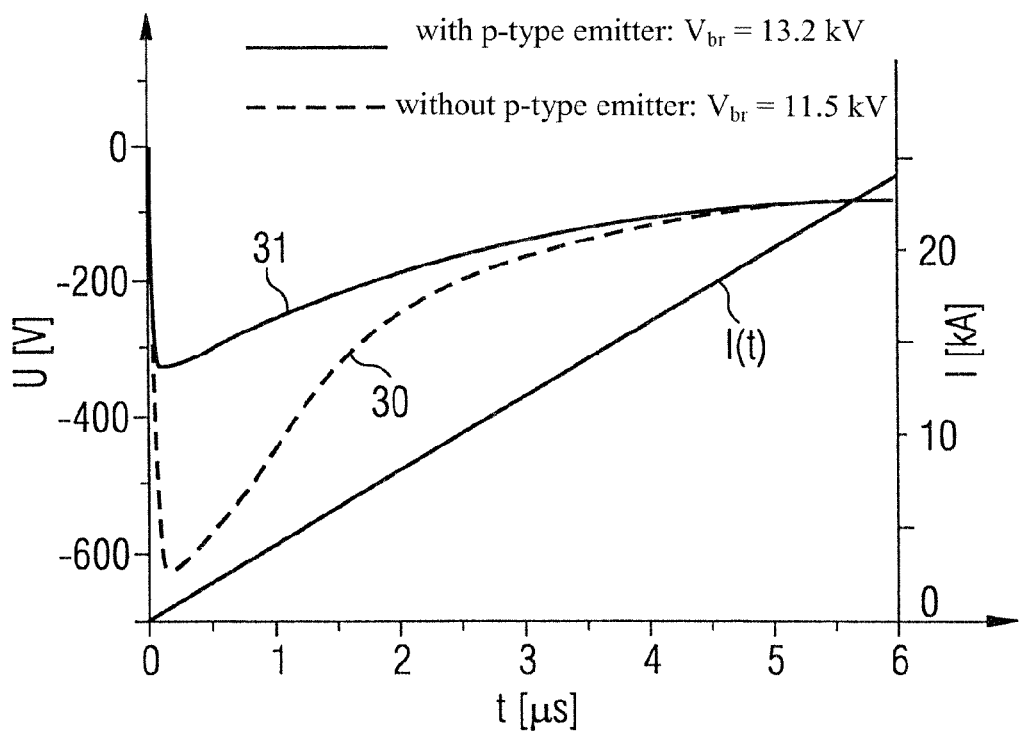
FIG. 4 illustrates the time profile for the diode voltage of the first diode with the time profile for the diode voltage of the second diode based on the prior art, in each case during the turn-on process and assuming a constant current rise.

FIG. 4 contrasts the time profile 30 of the diode voltage U of a diode based on a prior art and the time profile 31 of the diode voltage U of an inventive diode having a weakly p-doped zone 8 as illustrated in FIG. 1. The diodes have the relevant doping profiles illustrated in FIG. 3. For both diodes, the rise in the diode current over time I(t) has been chosen to be constant and of the same magnitude.

It can be seen that with a conventional diode a negative voltage peak occurs whose magnitude is greater than 600 V, whereas the magnitude of the corresponding negative voltage peak of a diode having a weakly p-doped zone is only a little more than 300 V. Another effect is that the additional weakly p-doped zone 8 can bring about not only a reduction in the transient voltage overshoot in the anode/cathode voltage which occurs when the diode is turned on but also an increase in the diode's breakdown voltage.

Thus, by way of example, a diode having a net dopant concentration 21 as illustrated in FIG. 3 has a breakdown voltage of 13.2 kV, whereas the breakdown voltage of the conventional diode with a net dopant concentration 20 as illustrated in FIG. 3 is just 11.5 kV.

The embodiments explained above are suitable particularly for diodes with high reverse voltages of at least 4 kV, at least 4.5 kV or at least 5 kV, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a diode comprising:
providing a semiconductor body having a weak n-type base doping; and
fabricating the weakly p-doped zone by introducing aluminum into the semiconductor body from the front and subsequently diffusing the aluminum into the semiconductor body to a depth, measured from the front, which is between 25% and 50% of the total thickness of the semiconductor body.

2. The method of claim 1, comprising introducing aluminum by implantation.

3. The method of claim 1, comprising diffusing the aluminum, having been introduced into the semiconductor body, into the semiconductor body to a depth, measured from the front, of between 40% and 50% of the total thickness.

4. The method of claim 1, comprising fabricating the weakly p-doped zone such that a net acceptor concentration in the weakly p-doped zone is between $1 \cdot 10^{12}$ cm$^{-3}$ and $1 \cdot 10^{14}$ cm$^{-3}$.

5. A method for fabricating a diode comprising:
providing a semiconductor body having a front and a back, opposite the front in a vertical direction of the semiconductor body, the semiconductor body having a weak n-type base doping;
fabricating an n-doped field stop zone by diffusing sulfur and/or selenium into the semiconductor body from its back; and
fabricating a weakly p-doped zone in the semiconductor body such that the weakly p-doped zone has a depth measured from the front, which is between 25% and 50% of the total thickness of the semiconductor body.

6. The method of claim 5, wherein the weakly n-doped zone has a minimum thickness of at least 400 µm.

7. The method of claim 5, wherein the weakly n-doped zone has a minimum thickness of at least 450 µm.

8. The method of claim 5, wherein the weakly n-doped zone has a minimum thickness of at least 500 µm.

9. The method of claim 5 comprising fabricating the weak p-type base doping such that a net acceptor concentration in the weak p-type base doping is between $1 \cdot 10^{12}$ cm$^{-3}$ and $1 \cdot 10^{14}$ cm$^{-3}$.

10. A method for fabricating a semiconductor body comprising:
fabricating a back;
fabricating a heavily n-doped zone adjacent the back;
fabricating a weakly n-doped zone adjacent the heavily n-doped zone by diffusing sulfur and/or selenium into the semiconductor body from the back;
fabricating a weakly p-doped zone adjacent the weakly n-doped zone;
fabricating a heavily p-doped zone adjacent the weakly p-doped zone; and
fabricating a front adjacent the heavily p-doped zone; and
fabricating the weakly p-doped zone such that it has a thickness in a vertical direction that is at least 25% and at most 50% of the distance between the front and back of the semiconductor body in the vertical direction.

11. The method of claim 10 further comprising fabricating the weakly p-doped zone such that it has a thickness in a vertical direction that is at least 25% and at most 50% of the distance between the front and back of the semiconductor body in the vertical direction.

12. The method of claim 10 further comprising fabricating the weakly p-doped zone such that a net acceptor concentration in the weakly p-doped zone is between $1 \cdot 10^{12}$ cm$^{-3}$ and $1 \cdot 10^{14}$ cm$^{-3}$.

* * * * *